United States Patent [19]

Srinivasan et al.

[11] Patent Number: 5,731,235
[45] Date of Patent: Mar. 24, 1998

[54] METHODS OF FORMING A SILICON NITRITE FILM, A CAPACITOR DIELECTRIC LAYER AND A CAPACITOR

[75] Inventors: Anand Srinivasan; Sujit Sharan; Gurtej S. Sandhu, all of Boise, Id.

[73] Assignee: Micron Technology, Inc., Boise, Id.

[21] Appl. No.: 739,170

[22] Filed: Oct. 30, 1996

[51] Int. Cl.$^6$ .................................. H01L 21/318
[52] U.S. Cl. .................. 438/253; 438/396; 438/703; 438/775; 438/757; 438/761; 438/791
[58] Field of Search ............................ 437/241, 919, 437/60, 242; 148/DIG. 14, DIG. 112, DIG. 114; 438/253, 396, 775, 791, 757, 761, 703

[56] References Cited

U.S. PATENT DOCUMENTS

| | | | |
|---|---|---|---|
| 3,627,598 | 12/1971 | McDonald | 156/17 |
| 5,324,679 | 6/1994 | Kim et al. | 437/52 |
| 5,350,707 | 9/1994 | Ko et al. | 437/52 |
| 5,376,593 | 12/1994 | Sandhu et al. | 437/242 |
| 5,459,105 | 10/1995 | Matsuura | 438/261 |
| 5,504,029 | 4/1996 | Murata et al. | 437/52 |
| 5,508,542 | 4/1996 | Geiss et al. | 257/301 |
| 5,523,596 | 6/1996 | Ohi et al. | 257/296 |

Primary Examiner—Charles L. Bowers, Jr.
Assistant Examiner—Matthew Whipple
Attorney, Agent, or Firm—Wells, St. John, Roberts, Gregory & Matkin, P.S.

[57] ABSTRACT

A method of forming silicon nitride includes, a) forming a first layer comprising silicon nitride over a substrate; b) forming a second layer comprising silicon on the first layer; and c) nitridizing silicon of the second layer into silicon nitride to form a silicon nitride comprising layer, the silicon nitride comprising layer comprising silicon nitride of the first and second layers. Further, a method of forming a capacitor dielectric layer of silicon nitride includes, a) forming a first capacitor plate layer; b) forming a first silicon nitride layer over the first capacitor plate layer; c) forming a silicon layer on the silicon nitride layer; d) nitridizing the silicon layer into a second silicon nitride layer; and e) forming a second capacitor plate layer over the second silicon nitride layer. Also, a method of forming a capacitor dielectric layer over a capacitor plate layer includes, a) forming a first layer of dielectric material over a capacitor plate layer; b) conducting a pin-hole widening wet etch of the first layer; and c) after the wet etch, forming a pin-hole plugging second layer of dielectric material on the first layer and within the widened pin-holes.

24 Claims, 4 Drawing Sheets

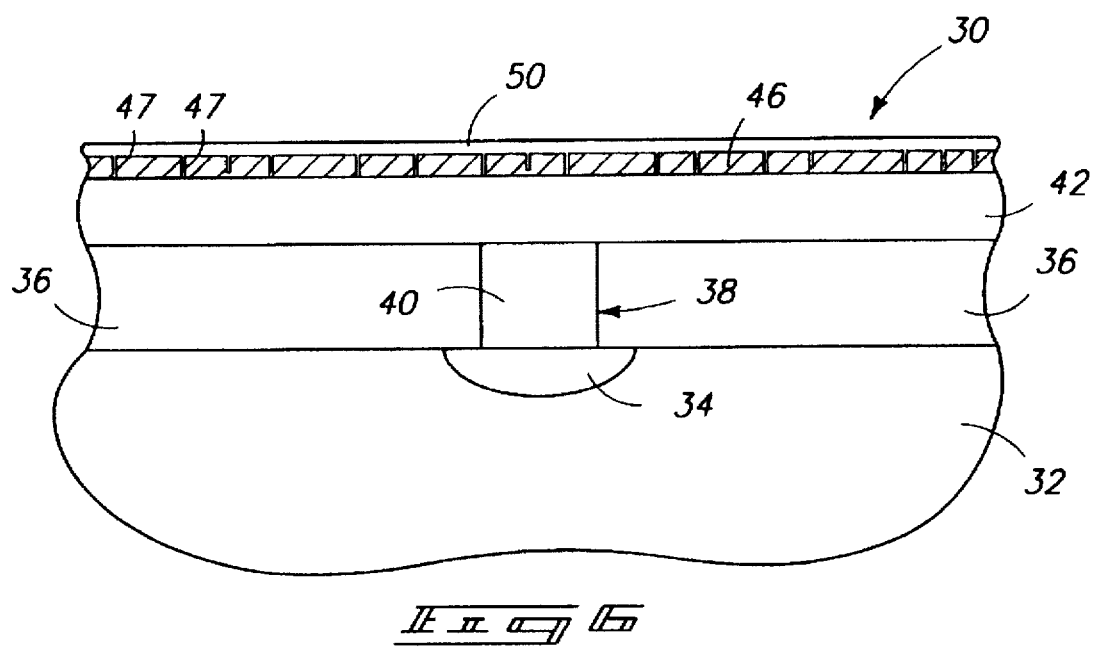
F I G 6
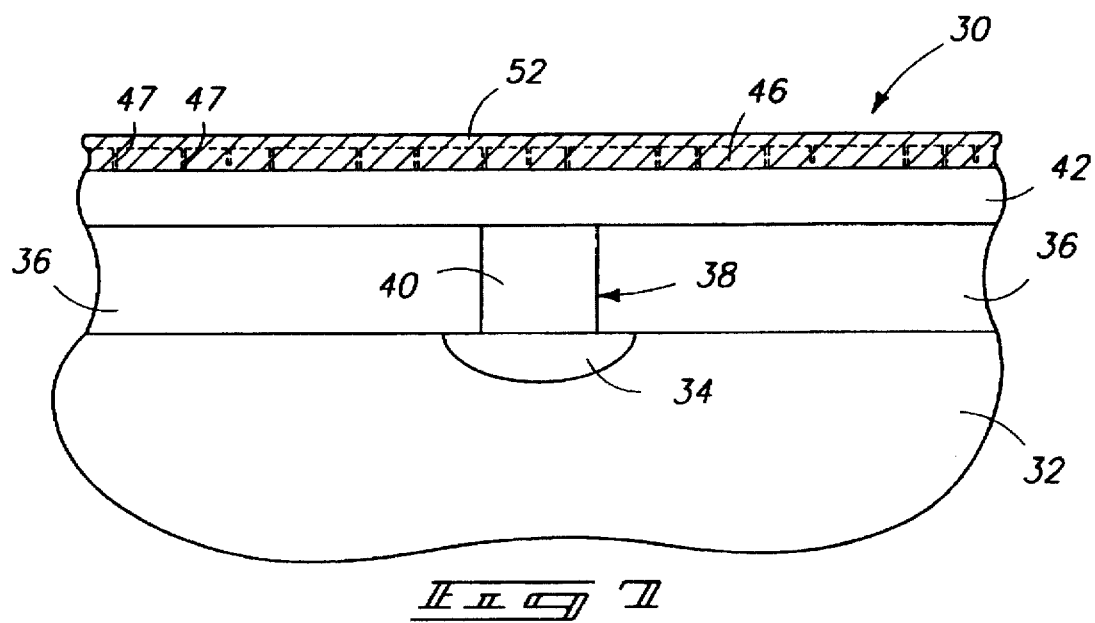
F I G 7

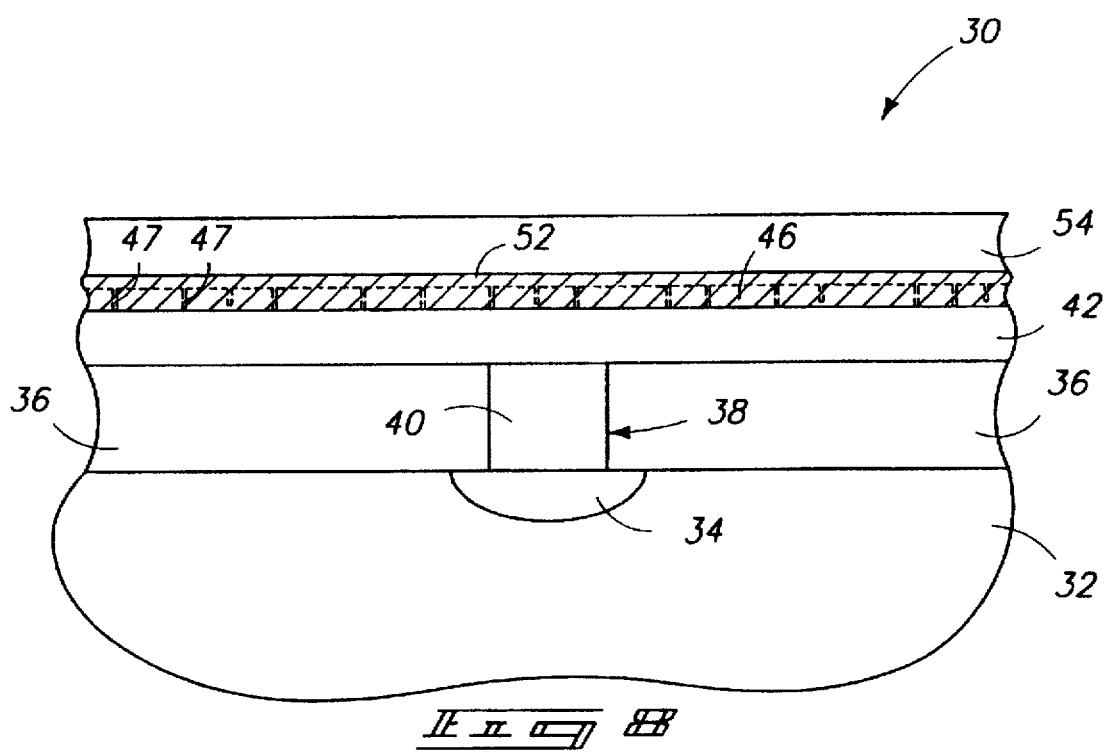
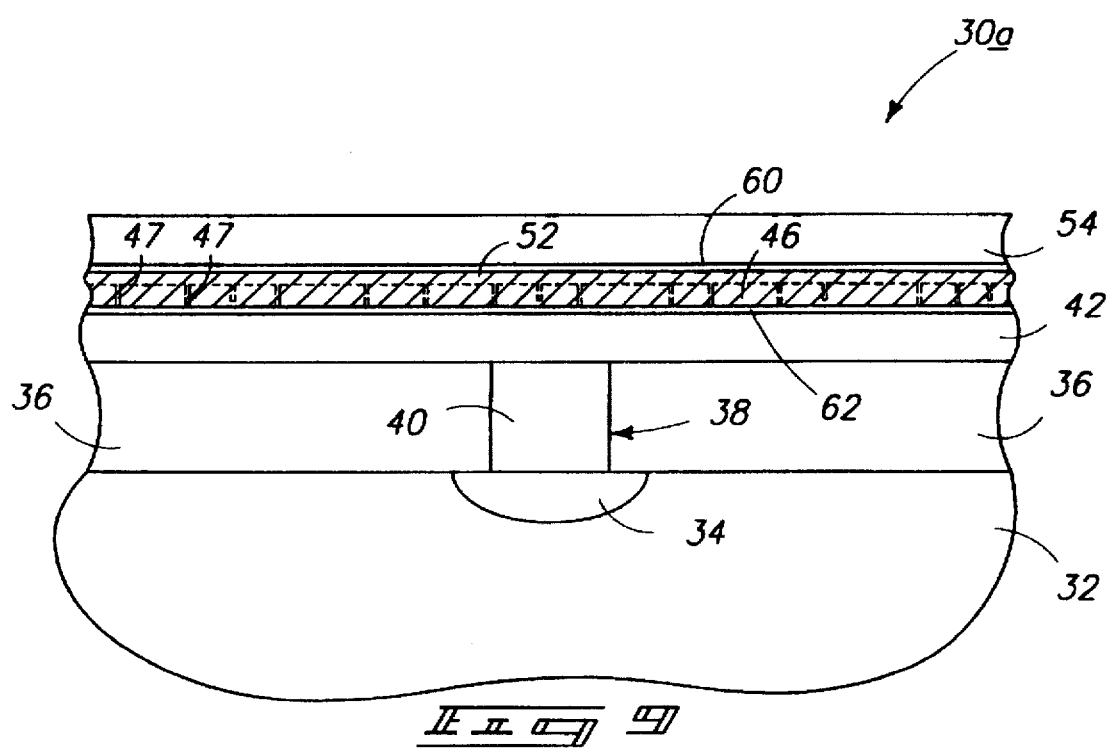

METHODS OF FORMING A SILICON NITRITE FILM, A CAPACITOR DIELECTRIC LAYER AND A CAPACITOR

TECHNICAL FIELD

This invention relates to methods of forming silicon nitride films, to methods of forming capacitor dielectric layers and to methods of forming capacitors.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors.

A capacitor is comprised of two conductive plates separated by a non-conducting dielectric layer. The dielectric layer is preferably comprised of one or more materials having a very high dielectric constant and low leakage current characteristics. Example materials include $SiO_2$ and $Si_3N_4$. $Si_3N_4$ is typically preferred due to its better dielectric properties than $SiO_2$. Numerous other capacitor dielectric materials have been and are being developed in an effort to meet the increasingly stringent requirements associated with the production of smaller and smaller capacitor devices used in higher density integrated circuitry. Most of these materials do, however, add increased process complexity or cost over utilization of conventional $Si_3N_4$ and $SiO_2$ capacitor dielectric materials. Yet the smaller and thinner capacitors being produced in next generation DRAM density are reaching the limit of the utility of using $Si_3N_4$ as a viable capacitor dielectric material.

Specifically, $Si_3N_4$ is typically deposited by low pressure chemical vapor deposition (i.e., any chemical vapor deposition process at less than or equal to 100 Torr). This does, however, undesirably produce very small pin-holes through thin layers of less than 200 Angstroms. These pin-holes undesirably reduce film density and result in undesired leakage current in operation. Once developed, these leakage current inducing pin-holes are difficult to repair. One technique is to form the capacitor dielectric layer as a composite of a $SiO_2/Si_3N_4/SiO_2$ composite. The strapping $SiO_2$ layers are utilized principally to cure or plug the pin-holes formed in the $Si_3N_4$. Conventional circuitry today provides the $SiO_2/Si_3N_4/SiO_2$ composite layer to thicknesses approaching 150 Angstroms. However, it is difficult at best to obtain thinner composite layers which achieve desirable dielectric film properties for such capacitor dielectric layers.

An alternate process for producing a $Si_3N_4$ layer having reduced pin-holes is by rapid thermal nitridation of a silicon layer utilizing a $N_2$ or $NH_3$ ambient. Such produces a considerably denser film having improved dielectric properties. However, the nitridation process is self limiting as the silicon from which the silicon nitride is created only derives from the outer silicon surface. This outer silicon surface is covered with silicon nitride during the initial nitridation. The nitrogen or ammonia is not capable of adequately diffusing through the initially formed silicon nitride to react with underlying silicon to produce more silicon nitride. Accordingly, the ultimate thickness of a silicon nitride film produced by nitridation is inherently self limited to thicknesses of less than 30 Angstroms. Such thickness is typically too low even for a substantially pin-hole free $Si_3N_4$ layer to adequately function as a capacitor dielectric layer between two conductive capacitor plates.

One proposed technique for formation of $Si_3N_4$ capacitor dielectric layers is to initially nitridize an outer silicon surface to obtain a 20 to 30 Angstrom thick layer. Subsequently, a silicon nitride film is deposited by low pressure chemical vapor deposition to achieve a desired overall thickness. Yet, the CVD deposited $Si_3N_4$ layer will still inherently have lower density and an undesired amount of leakage current inducing pin-holes which adversely impacts the overall capacitor dielectric layer.

Accordingly, it would be desirable to produce improved methods which enable the production of thin $Si_3N_4$ layer of adequate density to produce desired capacitor dielectric properties in a capacitor construction. Although the invention was principally motivated out of concerns associated with $Si_3N_4$ films, the artisan will appreciate applicability of the invention to other materials.

SUMMARY OF INVENTION

In one aspect, the invention provides a method of forming silicon nitride. In one implementation, the method is performed by forming a first layer comprising silicon nitride over a substrate. A second layer comprising silicon is formed on the first layer. The silicon of the second layer is nitridized into silicon nitride to form a silicon nitride comprising layer, which comprises silicon nitride of both the first and second layers.

In another aspect, the invention provides a method of forming a capacitor. In one implementation, the method is performed by forming a first capacitor plate layer. A first silicon nitride layer is formed over the first capacitor plate layer. A silicon layer is formed on the silicon nitride layer. The silicon layer is nitridized into a second silicon nitride layer. A second capacitor plate layer is formed over the second silicon nitride layer.

In yet another aspect, the invention provides a method of forming a capacitor dielectric layer over a capacitor plate layer. In one implementation, the method is performed by forming a first layer of dielectric material over a capacitor plate layer. A pin-hole widening wet etch of the first layer is conducted. After the wet etch, a pin-hole plugging second layer of dielectric material is formed on the first layer and within the widened pin-holes.

BRIEF DESCRIPTION OF THE DRAWINGS

Preferred embodiments of the invention are described below with reference to the following accompanying drawings.

FIG. 6 is a view of the FIG. 5 wafer fragment at a processing step subsequent to that shown by FIG. 5.

FIG. 7 is a view of the FIG. 5 wafer fragment at a processing step subsequent to that shown by FIG. 6.

FIG. 8 is a view of the FIG. 5 wafer fragment at a processing step subsequent to that shown by FIG. 7.

FIG. 9 is a diagrammatic sectional view of a substrate or semiconductor wafer fragment at another alternate processing step in accordance with the invention.

DETAILED DESCRIPTION OF THE PREFERRED EMBODIMENTS

Figure 1:
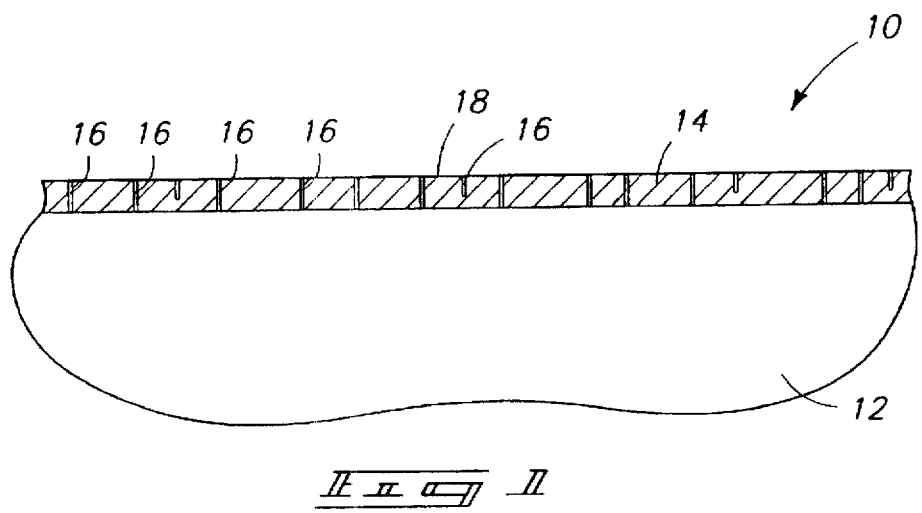
FIG. 1 is a diagrammatic sectional view of a substrate or semiconductor wafer fragment at one processing step in accordance with the invention.

This disclosure of the invention is submitted in furtherance of the constitutional purposes of the U.S. Patent Laws "to promote the progress of science and useful arts" (Article 1, Section 8).

A first preferred embodiment of forming a silicon nitride layer is described with reference to FIGS. 1–4, where a substrate or wafer fragment is indicated generally with reference numeral 10. Such comprises a substrate 12, such as $SiO_2$, and an $Si_3N_4$ layer 14 formed thereover. Layer 14 includes an outer surface 18. An example method for producing layer 14 is by a conventional prior art low pressure chemical vapor deposition utilizing, for example, $NH_3$ and $SiH_4$ as precursor gases at a temperature greater than 400° C. and a pressure of from 10 mTorr to 200 mTorr. This will typically undesirably produce the diagrammatic illustrated pin-holes 16 extending within and through layer 14. An example thickness for layer 14 is less than or equal to 200 Angstroms. Less than 50 Angstroms is more preferred where a goal is to produce a thin $Si_3N_4$ layer having an ultimate overall thickness of less than 50 Angstroms with acceptable dielectric properties to be utilized in a capacitor.

Figure 2:
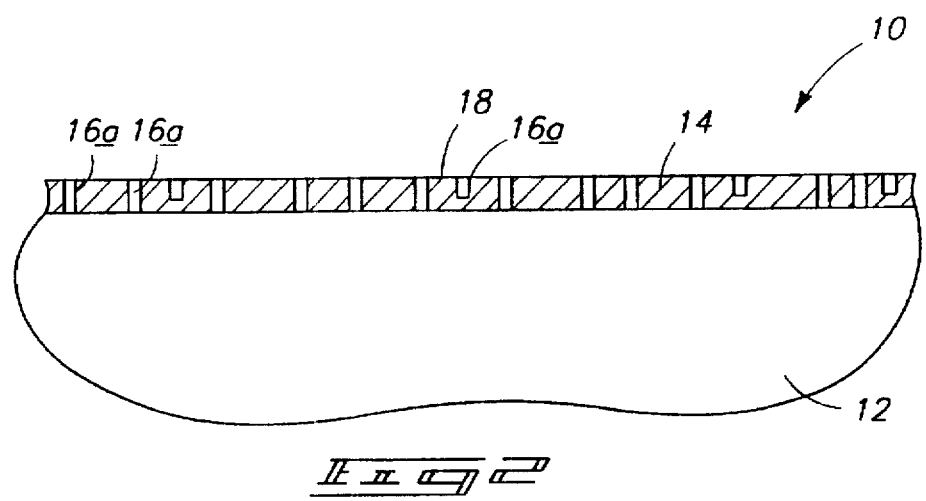
FIG. 2 is a view of the FIG. 1 wafer at a processing step subsequent to that shown by FIG. 1.

Referring to FIG. 2, outer surface 18 is etched, preferably utilizing a wet acid etching solution of for example $H_3PO_4$ (phosphoric acid) at a temperature greater than or equal to about 100° C. A specific example would be to use a 6M $H_3PO_4$ solution at 150° C. and atmospheric pressure for one minute. Such will typically widen the FIG. 1 pin-holes as is diagrammatically depicted with reference numerals 16a.

Figure 3:
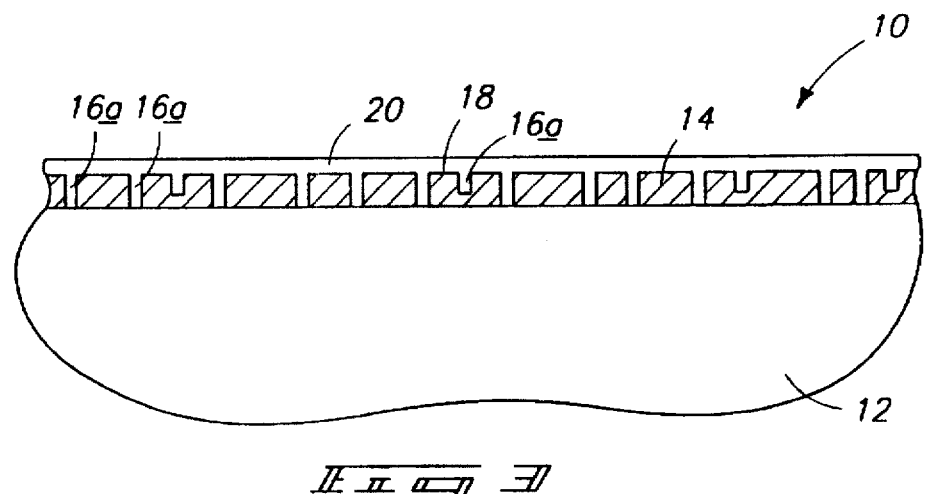
FIG. 3 is a view of the FIG. 1 wafer at a processing step subsequent to that shown by FIG. 2.

Referring to FIG. 3, a second layer 20 comprising silicon is formed on first layer 14 and within widened pin-holes 16a. Widening of such pin-holes in the preferred embodiment is believed to facilitate more conformal and complete filling of such holes with material of silicon layer 20 such that a more void-free layer results. Silicon layer 20 is preferably deposited to a thickness of less than or equal to about 50 Angstroms and by low pressure chemical vapor deposition such as using $SiH_4$ at greater than or equal to 600° C. and at a pressure of from 1 mTorr to 100 mTorr.

Figure 4:
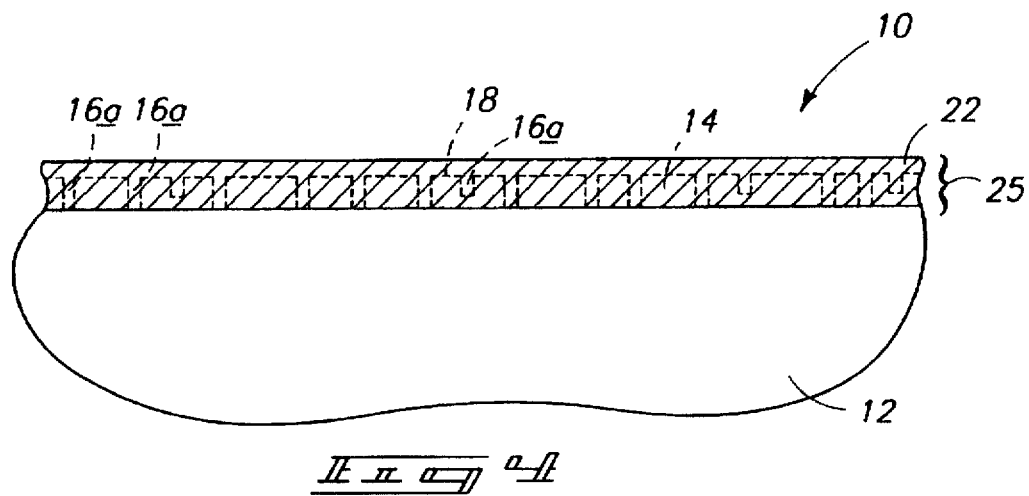
FIG. 4 is a view of the FIG. 1 wafer at a processing step subsequent to that shown by FIG. 3.

Referring to FIG. 4, the substrate is subjected to a nitridation step such that silicon of second layer 20 is nitridized into $Si_3N_4$ 22 to form a resultant silicon nitride composite layer 25 comprising silicon nitride of first layer 14 and second layer 22. An example and preferred nitridizing comprises rapid thermal nitridation in an $N_2$ atmosphere at a temperature greater than or equal to about 800° C. and a pressure from about 1 mTorr to about 100 mTorr. Such preferably, and as shown, results in a substantially pin-hole free $Si_3N_4$ layer 25, thus having greater density and reduced leakage current characteristics. Volume expansion of the silicon on the order of 2.0–2.5 times in forming $Si_3N_4$ facilitates complete pin-hole plugging. The deposited or formed thicknesses of layers 14 and layer 20 are preferably chosen to provide a resultant thickness of layer 25 of less than or equal to about 50 Angstroms, where the goal is a capacitor dielectric layer of such thinness in achieving reduced device size and increased circuit density.

Figure 5:
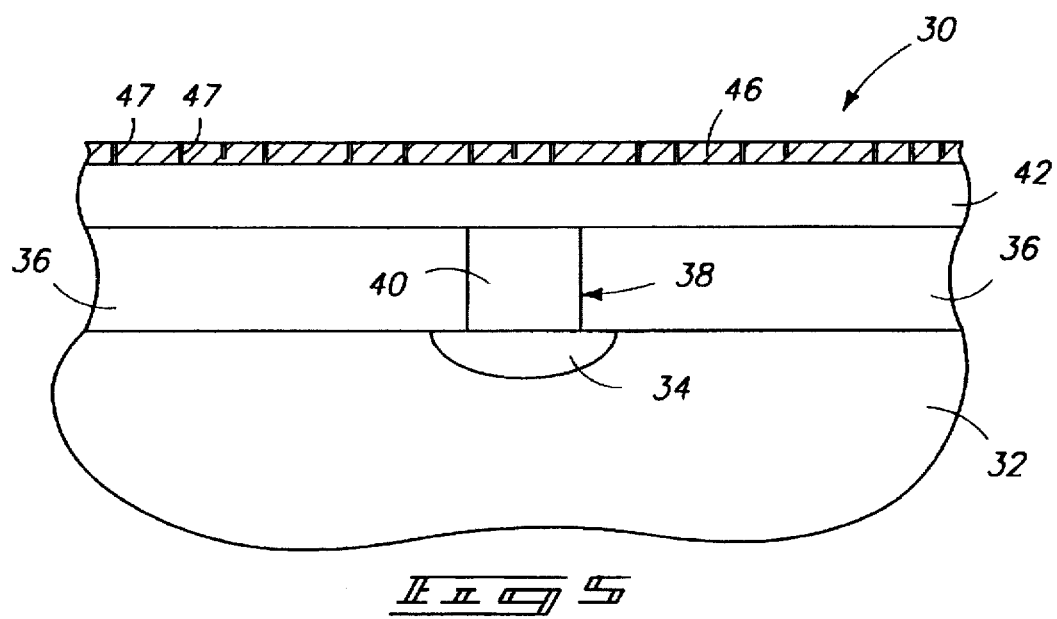
FIG. 5 is a diagrammatic sectional view of a substrate or semiconductor wafer fragment at one alternate processing step in accordance with the invention.

Utilization of the above described process in a capacitor construction is described with reference to FIGS. 5–8. FIG. 5 illustrates a semiconductor wafer fragment 30 comprised of a bulk monocrystalline silicon substrate 32 having an example diffusion region 34 provided therein. A layer 36 of an insulating dielectric material is provided outwardly of substrate 32. A contact opening 38 is provided therethrough to diffusion region 34, with such being filed with an electrically conductive plugging material such as tungsten or polysilicon. A first electrically conductive capacitor plate layer 42 (i.e., conductively doped polysilicon) is provided outwardly of insulating dielectric layer 36 and in ohmic electrical connection with conductive plugging material 40. A first silicon nitride layer 46 is provided over and directly on first capacitor plate layer 42. Such would typically include the undesired illustrated pin-holes 47 formed therein. Preferably, the illustrated FIG. 5 construction would be subjected to a wet etch to widen such pin-holes to facilitate more substantial or complete filling by a subsequently deposited silicon layer.

Referring to FIG. 6, a silicon layer 50 is formed on silicon nitride layer 46.

Referring to FIG. 7, silicon layer 50 is nitridized as described above into a silicon nitride material 52.

Referring to FIG. 8, a second capacitor plate layer 54 (i.e. conductively doped polysilicon) is provided over second silicon nitride layer 52.

An alternate embodiment 30a is shown in FIG. 9. Like numerals from the FIGS. 5–8 embodiment are utilized where appropriate, with differences being indicated by the suffix "a" or with different numerals. Wafer 30a illustrates an intervening oxide layer 60 formed intermediate second silicon nitride layer 52 and second capacitor plate layer 54, and an oxide layer 62 formed intermediate first capacitor plate layer 42 and first silicon nitride layer 46.

All of the above described processing could of course be conducted in situ in a single deposition reactor. Further, various in situ or separate surface cleans of the various surfaces could be conducted in between depositions. Clean and continuous surface interfaces between the layers is highly desirable in achieving desired resultant capacitor constructions, especially in high density advanced DRAMs.

The above described process makes it possible to grow thinner nitride films having superior electrical and mechanical properties. The method provides a simpler solution for advanced DRAM memory cell fabrication compared to use of alternate materials having higher dielectric constants. The above process is likewise easily integrable in conventional DRAM and other circuitry fabrication flows.

Although the invention was motivated principally in connection with pin-hole problems associated with silicon nitride layers, the artisan will appreciate applicability to other possible materials in the context of capacitor dielectric layer fabrication. For example, alternate materials might be utilized for layers 50/52 and 46 than silicon or silicon nitride. Further as in the above described embodiment, the second layer 50 can be deposited to initially be different from first layer 46, with such layer subsequently being transformed to be substantially the same as first layer 46.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a capacitor comprising the following steps:
   forming a first capacitor plate layer;
   forming a first silicon nitride layer over the first capacitor plate layer, the first silicon nitride layer having an outer surface;
   etching the first silicon nitride layer outer surface;
   after etching the first silicon nitride layer outer surface, forming a silicon layer on the first silicon nitride layer;
   nitridizing the silicon layer into a second silicon nitride layer; and
   forming a second capacitor plate layer over the second silicon nitride layer.

2. The method of forming a capacitor of claim 1 further comprising forming at least one oxide layer intermediate the first capacitor plate layer and the first silicon nitride layer.

3. The method of forming a capacitor of claim 1 further comprising forming at least one oxide layer intermediate the second silicon nitride layer and the second capacitor plate layer.

4. The method of forming a capacitor of claim 1 further comprising forming at least one oxide layer intermediate the first capacitor plate layer and the first silicon nitride layer, and at least one oxide layer intermediate the second silicon nitride layer and the second capacitor plate layer.

5. The method of forming a capacitor of claim 1 wherein the first silicon nitride layer is formed on the first capacitor plate layer.

6. The method of forming a capacitor of claim 1 wherein the silicon layer is formed by chemical vapor deposition to a thickness of less than or equal to about 50 Angstroms.

7. The method of forming a capacitor of claim 1 wherein,
   the first silicon nitride layer is formed by low pressure chemical vapor deposition to a thickness of less than about 50 Angstroms; and
   the second silicon nitride layer is formed to a thickness of less than about 50 Angstroms to provide a combined first and second silicon nitride layer thickness of less than or equal to about 50 Angstroms.

8. The method of forming a capacitor of claim 1 wherein the nitridizing comprises rapid thermal nitridation at a temperature greater than or equal to about 800° C. and a pressure from about 1 mTorr to about 100 mTorr.

9. A method of forming a capacitor dielectric layer over a capacitor plate layer comprising the following steps:
   forming a silicon nitride layer over a capacitor plate layer, the silicon nitride layer having an outer surface having pin holes formed therein;
   conducting a pin-hole widening wet etch of the silicon nitride layer;
   after the wet etch, forming a silicon layer on the silicon nitride layer and within the widened pin-holes; and
   nitridizing the silicon layer into silicon nitride.

10. The method of forming a capacitor dielectric layer of claim 9 wherein the wet etch comprises exposure to an $H_3PO_4$ solution at a temperature greater than or equal to about 100° C.

11. The method of forming a capacitor dielectric layer of claim 9 wherein the nitridizing comprises rapid thermal nitridation at a temperature greater than or equal to about 800° C. and a pressure from about 1 mTorr to about 100 mTorr.

12. The method of forming a capacitor dielectric layer of claim 9 wherein the silicon layer is formed by chemical vapor deposition to a thickness of less than or equal to about 50 Angstroms.

13. The method of forming a capacitor dielectric layer of claim 9 wherein,
   the silicon nitride layer is formed by low pressure chemical vapor deposition to a thickness of less than or equal to about 200 Angstroms; and
   the silicon layer is formed by chemical vapor deposition to a thickness of less than or equal to about 50 Angstroms.

14. A method of forming a capacitor dielectric layer over a capacitor plate layer comprising the following steps:
   forming a silicon nitride layer over a capacitor plate layer, the silicon nitride layer having an outer surface having pin holes formed therein;
   conducting a pin-hole widening wet etch of the silicon nitride layer; and
   after the wet etch, forming a pin-hole plugging dielectric layer on the silicon nitride layer and within the widened pin-holes.

15. The method of forming a capacitor dielectric layer of claim 14 wherein the wet etch comprises exposure to an $H_3PO_4$ solution at greater than or equal to about 100° C.

16. The method of forming a capacitor dielectric layer of claim 14 wherein,
   the silicon nitride layer is formed by low pressure chemical vapor deposition to a thickness of less than or equal to about 200 Angstroms; and
   the pin-hole plugging dielectric layer is formed by chemical vapor deposition to a thickness of less than or equal to about 50 Angstroms.

17. The method of forming a capacitor dielectric layer of claim 14 wherein,
   the silicon nitride layer is formed by low pressure chemical vapor deposition to a thickness of less than about 50 Angstroms; and
   the pin-hole plugging dielectric layer is formed by chemical vapor deposition to a thickness of less than about 50 Angstroms to provide a combined silicon nitride and pin-hole plugging dielectric layer thickness of less than or equal to about 50 Angstroms.

18. A method of forming a capacitor dielectric layer over a capacitor plate layer comprising the following steps:
   forming a first layer of dielectric material over a capacitor plate layer, the first layer of dielectric material having an outer surface having pin holes formed therein;
   conducting a pin-hole widening wet etch of the first layer; and
   after the wet etch, forming a pin-hole plugging second layer of dielectric material on the first layer and within the widened pin-holes.

19. The method of forming a capacitor dielectric layer of claim 18 wherein the second layer is different from the first layer.

20. The method of forming a capacitor dielectric layer of claim 18 wherein the second layer is deposited to initially be different from the first layer, the method further comprising transforming the deposited second layer to be substantially the same as the first layer.

21. The method of forming a capacitor dielectric layer of claim 18 wherein,
   the first layer is formed by low pressure chemical vapor deposition to a thickness of less than or equal to about 200 Angstroms; and
   the pin-hole plugging second layer is formed by chemical vapor deposition to a thickness of less than or equal to about 50 Angstroms.

22. The method of forming a capacitor dielectric layer of claim 18 wherein, the first layer is formed by low pressure chemical vapor deposition to a thickness of less than about 50 Angstroms; and the pin-hole plugging second layer is formed by chemical vapor deposition to a thickness of less than or equal to about 50 Angstroms to provide a combined first and pin-hole plugging second layer thickness of less than about 50 Angstroms.

23. A method of forming a capacitor dielectric layer over a capacitor plate layer comprising the following steps:

forming a first layer of dielectric material over a capacitor plate layer, the first layer of dielectric material having an outer surface and comprising a first type of material;

etching the outer surface of the first layer;

after the etching, forming second layer of dielectric material on the first layer, the second layer of dielectric material comprising a second type of material; and converting the second type of material of the second layer to the first type of material.

24. A method of forming a capacitor dielectric layer over a capacitor plate layer comprising the following steps:

forming a first layer of dielectric material over a capacitor plate layer, the first layer of dielectric material having an outer surface having pin holes formed therein;

widening the pin-holes of the first layer; and after the widening, forming a second layer of dielectric material within the widened pin-holes.

* * * * *